United States Patent
Fiori et al.

(10) Patent No.: US 9,638,589 B2
(45) Date of Patent: May 2, 2017

(54) METHOD FOR DETERMINING A THREE-DIMENSIONAL STRESS FIELD OF AN OBJECT, AN INTEGRATED STRUCTURE IN PARTICULAR, AND CORRESPONDING SYSTEM

(71) Applicants: STMICROELECTRONICS SA, Montrouge (FR); STMICROELECTRONICS (CROLLES 2) SAS, Crolles (FR)

(72) Inventors: Vincent Fiori, Grenoble (FR); Pierre Bar, Grenoble (FR); Sébastien Gallois-Garreignot, Grenoble (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 233 days.

(21) Appl. No.: 14/311,497

(22) Filed: Jun. 23, 2014

(65) Prior Publication Data
US 2014/0373640 A1    Dec. 25, 2014

(30) Foreign Application Priority Data
Jun. 25, 2013   (FR) ..................... 13 56085

(51) Int. Cl.
*G01L 1/00*  (2006.01)
*G01L 1/20*  (2006.01)
(Continued)

(52) U.S. Cl.
CPC .............. *G01L 1/20* (2013.01); *G01B 7/18* (2013.01); *G01L 1/2287* (2013.01); *G01L 5/161* (2013.01); *G01L 25/00* (2013.01); *H01L 22/34* (2013.01)

(58) Field of Classification Search
CPC ....... G01L 5/161; G01L 5/162; G01L 5/0019; G01L 25/00; G01L 1/2287; G01L 1/20;
(Continued)

(56) References Cited

U.S. PATENT DOCUMENTS 4,480,478 A    11/1984  Sato et al.
4,565,000 A *   1/1986  Brokaw .............. H01C 17/22
                                              257/E27.047
(Continued)

FOREIGN PATENT DOCUMENTS

WO    2012068671    5/2012

OTHER PUBLICATIONS

Cho et al "The Effect of the Transverse Sensitivity on Measurement of the Piezoresistive Coefficients of Silicon" Japanese Journal of Applied Physics; Japan Society of Applied Physics Through the Institute of Pure and Applied Physics Japan vol. 47 No. 5 (May 2008) pp. 3647-3656.

(Continued)

*Primary Examiner* — Harshad R Patel
*Assistant Examiner* — Brandi Hopkins
(74) *Attorney, Agent, or Firm* — Slater Matsil, LLP (57) ABSTRACT

A method and corresponding system are provided for determining a three-dimensional stress field of an object having a flat surface. At least four flat resistors are placed on the flat surface of the object, with at least one of the resistors having a geometry different from that of the others. A variation of resistance of the resistors is measured. The three-dimensional stress field is determined from a system of equations involving the stress field, values of variations of the measured resistive values and sensitivity parameters of the resistors.

33 Claims, 4 Drawing Sheets (51) Int. Cl.
G01L 25/00 (2006.01)
G01B 7/16 (2006.01)
G01L 1/22 (2006.01)
G01L 5/16 (2006.01)
H01L 21/66 (2006.01)

(58) Field of Classification Search
CPC ........ G01P 15/123; G01P 15/18; B60T 8/171;
B60T 2240/06; B60T 8/172; B60T 8/52;
B60T 2210/12; B60G 2204/115; B60G
2401/12; B60G 2400/64; G01B 7/18;
H01L 22/34
USPC ............... 73/862.044, 11.07, 862.68, 514.33
See application file for complete search history.

(56) References Cited

U.S. PATENT DOCUMENTS

| | | | |
|---|---|---|---|
| 5,600,071 | A | 2/1997 | Sooriakumar et al. |
| 5,726,744 | A | 3/1998 | Ferdinand et al. |
| 6,164,119 | A | 12/2000 | Miyazaki |
| 6,948,377 | B2 | 9/2005 | Wingett et al. |
| 6,951,143 | B1* | 10/2005 | Adderton ............... G01L 5/161 73/862.044 |
| 8,174,084 | B2 | 5/2012 | Farahani et al. |
| 2003/0082836 | A1* | 5/2003 | Fetterman ............... H01L 22/34 438/14 |
| 2005/0274201 | A1 | 12/2005 | Miyazaki |
| 2008/0295610 | A1* | 12/2008 | Inamori ............... G01L 1/2262 73/862.044 |
| 2010/0154555 | A1* | 6/2010 | Sumigawa ............... G01B 7/16 73/777 |
| 2010/0199783 | A1 | 8/2010 | Sakurai |
| 2013/0205910 | A1* | 8/2013 | Gharib ................ G01B 5/0014 73/777 |

OTHER PUBLICATIONS

Mian et al "The Van Der Pauw Stress Sensor" IEEE Sensors Journal vol. 6 No. 2 (Apr. 1, 2006) pp. 340-356 URL : http://ieeexplore.ieee.org/stamp/stamp.jsp?arnumber=01608075.

Chaparala et al "A New Technique for Calibrating Piezoresistive Stress Sensor Chips" Thermal and Thermomechanical Phenomena in Electronic Systems Itherm 2008 11th Intersociety Conference on (May 28, 2008) pp. 720-725.

Tian et al "Design Fabrication and Calibration of a Piezoresistive Stress Sensor on SOI Wafers for Electonic Packaging Applications" IEEE Transactions and Components and Packaging Technologies vol. 32 No. 2 (Jun. 1, 200) pp. 513-520.

Trigg et al. "Modular sensor chip design for package stress evaluation and reliability characterisation", Microelectronics Reliability 52(8):1581-1585 • Jul. 2012. Abstract Only.

Kasbari et al. "Embedded stress sensors for strained technologies process control", IEEE Transactions on Semiconductor Manufacturing 21(3):352-357 • Aug. 2008.

Jaeger et al. "A piezoresistive sensor chip for measurement of stress in electronic packaging", 43rd Electronic Components and Technology Conference, Jun. 11-4, 1993; p. 686-92. Abstract Only.

Hussain et al. , "Error analysis for piezoresistive stress sensors used in flip chip packaging", 12th IEEE Intersociety Conference on Thermal and Thermomechanical Phenomena in Electronic Systems, p. 12 pp., Jul. 2010. Abstract Only.

Blayac et al., "Mechanical-Electrical Measurements and Relevant Test Structures for Sensing Interconnect Stress Effects in CMOS Technology", IEEE Transactions on Semiconductor Manufacturing, Issue: 99. Abstract Only.

Zou et al. "Comparison of die level stresses in chip-on-board packages processed with convection and variable frequency microwave encapsulant curing", Proceedings of the SPIE—The International Society for Optical Engineering, v 3830, p. 7-16, 1999. Abstract Only.

Shah et al. "In situ ultrasonic force signals during low-temperature thermosonic copper wire bonding", Microelectronic Engineering 85(9):1851-1857 • Aug. 2008. Abstract Only.

Doelle et al., "Piezo-FET stress-sensor arrays for wire-bonding characterization", Journal of Microelectromechanical Systems, v 15, n 1, p. 120-30, Feb. 2006.

Suhling et al., "Silicon piezoresistive stress sensors and their application in electronic packaging", IEEE Sensors Journal, v 1, n 1, p. 14-30, Jun. 2001.

R.Vayrette << Analyse des contraintes mécaniques et de la résistivité des interconnexions de cuivre des circuits intégrés: Rôle de la microstructure et du confinement géométrique. >>, PhD Thesis, Feb. 2011. Machine/Google Translation of General Introduction Section Only.

* cited by examiner

METHOD FOR DETERMINING A THREE-DIMENSIONAL STRESS FIELD OF AN OBJECT, AN INTEGRATED STRUCTURE IN PARTICULAR, AND CORRESPONDING SYSTEM

FIELD OF THE INVENTION

The invention relates to the determination of mechanical stress fields, and, in particular, within integrated structures.

BACKGROUND OF THE INVENTION

Integrated structures can comprise stacks of integrated circuits or stacks of integrated circuits with interposers (i.e., interconnection supports). Interposers can also support several integrated circuits.

The mechanical stresses inside integrated structures can cause fractures or even delaminations separating several integrated circuits or supports that are assembled together. The mechanical stresses can be induced by stages in the manufacture of integrated circuits, and they can have an impact on performance of the products. The stresses therefore have a mechanical impact and an electrical impact within integrated structures. It is therefore advantageous to know the stress field values within structures.

It is possible to evaluate a unidimensional stress field using a resistor. On applying a mechanical stress to the resistor, a variation of the resistive value associated with the resistor appears and this variation is related to a sensitivity parameter. By way of indication, the variation of resistive values is equal to the product of the sensitivity value and the value of the unidimensional stress field.

Several identical resistors may be used to obtain bidimensional stress fields. However, it is not possible to obtain three-dimensional field values by using identical resistors placed on the same plane. Three-dimensional field values include, for example, components in a plane and components in a direction orthogonal to the plane.

To evaluate a three-dimensional stress field, it has been proposed to use a set of several resistors formed in silicon while using for at least one of the resistors a doping level that is different from that of the other resistors. However, this approach is complicated to implement and necessitates a large number of manufacturing stages.

SUMMARY OF THE INVENTION

According to one implementation and embodiment, a method for determining a three-dimensional stress field in a more straightforward manner and a corresponding system are provided.

Three-dimensional stress fields may be obtained by using a set of resistors comprising at least four flat resistors, at least one of which differs from the other three by its geometry.

According to one aspect, a method for determining a three-dimensional stress field of an object may comprise determining variations of resistive values of a group of resistors placed on the object, and determining the stress field from a system of equations involving the stress field, the variations of the resistive values, and the sensitivity parameters of the resistors.

According to a general feature of this aspect, the group of resistors may comprise at least four flat resistors, with at least one of the resistors having a geometry that is different from that of the others. The group of resistors may be formed on a same flat surface of the object.

Thus, contrary to the methods according to the prior art, resistors having different geometries may be used. In fact, by using at least one resistor having a different geometry, the system of equations relating the variations of resistive values to sensitivity parameters may be solved. The system of equations cannot be solved using resistors having identical geometries and placed on the same plane.

It is easier to use resistors having different geometries rather than silicon resistors having different doping levels. Advantageously, all of the resistors may contain a same material. It is thus possible to manufacture them simultaneously, whereas to manufacture resistors having different doping levels it may be necessary to use several stages of photolithography and of implantation of dopants.

It is particularly advantageous to use this method for an object, such as an integrated structure, within which it may be easy to simultaneously deposit the resistors, for example, by depositing metal (copper or aluminium) strips that are passive and not necessarily piezoresistive. It is also advantageous to know the stress field within such a structure for determining if a fracture or a delamination can occur during the process of manufacturing the structure. Moreover, an indication relating to the impact of mechanical stresses on the electrical performance of the integrated structure may be obtained.

Thus, the method may comprise at least a first step of manufacture of the structure to include flat surface, placing the resistors on the flat surface, and a first measurement of the resistive values of the resistors. The method may further comprise at least one additional step of manufacture of the structure, and a second measurement of resistive values of the resistors after the at least one additional manufacturing step. The variations of resistive values may be obtained by comparison of the resistive values obtained by the first measurement with the second measurement.

It may also be possible to obtain variations of resistive values by using the method at several locations in a same structure with identical groups of resistors. The resistive value of a resistor may then be compared with the resistive value of an identical resistor in another group of resistors in the structure.

The term "manufacturing step" refers to any step of depositing, etching, bonding or annealing which can cause the appearance of a stress field. Information relating to the mechanical stresses induced by the at least one additional manufacturing step may thus be obtained.

The method may comprise a determination of the sensitivity parameters from a simulation or from a test on a test structure. Thus, it may be possible to use a simulation for each resistor.

According to another aspect, a system may comprise an object comprising at least four flat resistors placed on a same flat surface of the object, with at least one of the resistors having a geometry different from that of the others. Means or a measurement unit may be used for measuring a variation of resistive values of the resistors. Means or a stress determination unit may be configured for determining a stress field from a system of equations involving the stress field, values of variations of measured resistive values and sensitivity parameters of the resistors.

The measurement unit for measuring a resistance variation and the stress determination unit for determining a stress field may be incorporated in the object or may also be disposed outside of the object. The object may be an integrated structure.

The resistors may comprise a conductive material chosen from the group comprising aluminium and copper. Each resistor may comprise a resistive serpentine shape, and may have a geometry different from that of the others. Each resistor may comprise a resistive serpentine shape with a different spacing between the lines forming the serpentine shape and/or a different width of line forming the serpentine shape.

The object may comprise four resistors forming a portion of a rosette among which two first resistors may have a first geometry and two second resistors may have a second geometry. The second resistors may be disposed at the two ends of the rosette, for example.

The term rosette refers to an arrangement, regular or circular shaped, of resistors in which all of the resistors are aligned according to concentric straight lines. The expression portion of a rosette refers to an arrangement that can be regular, in a portion of a circle, for example, a quadrant of a circle, with all of the resistors being aligned according to concentric straight lines.

The object may comprise eight resistors forming a complete rosette among which four first resistors have a first geometry and four second resistors have a second geometry. The first and second resistors may be disposed alternately in the rosette or on either side of an axis passing through the middle of the rosette.

The object may comprise eight resistors comprising first and second groups, each having four resistors. The first group of four resistors may include two resistors having a first geometry and two resistors having a second geometry. The first and second resistors of the first group may be disposed respectively on either side of a first chevron having a first angle. The second group of four resistors include two resistors having the first geometry and two resistors having the second geometry. The first and second resistors of the second group may be disposed respectively on either side of a second chevron having a second angle different from the first angle. The first chevron and the second chevron may be aligned.

According to another aspect, an object belonging to the system defined above is provided.

BRIEF DESCRIPTION OF THE DRAWINGS

Other advantages and features of the invention will become apparent on studying the detailed description of implementations and embodiments, given as examples that are not limiting and illustrated by the appended drawings, in which.

DETAILED DESCRIPTION OF THE PREFERRED EMBODIMENTS

Figure 1:
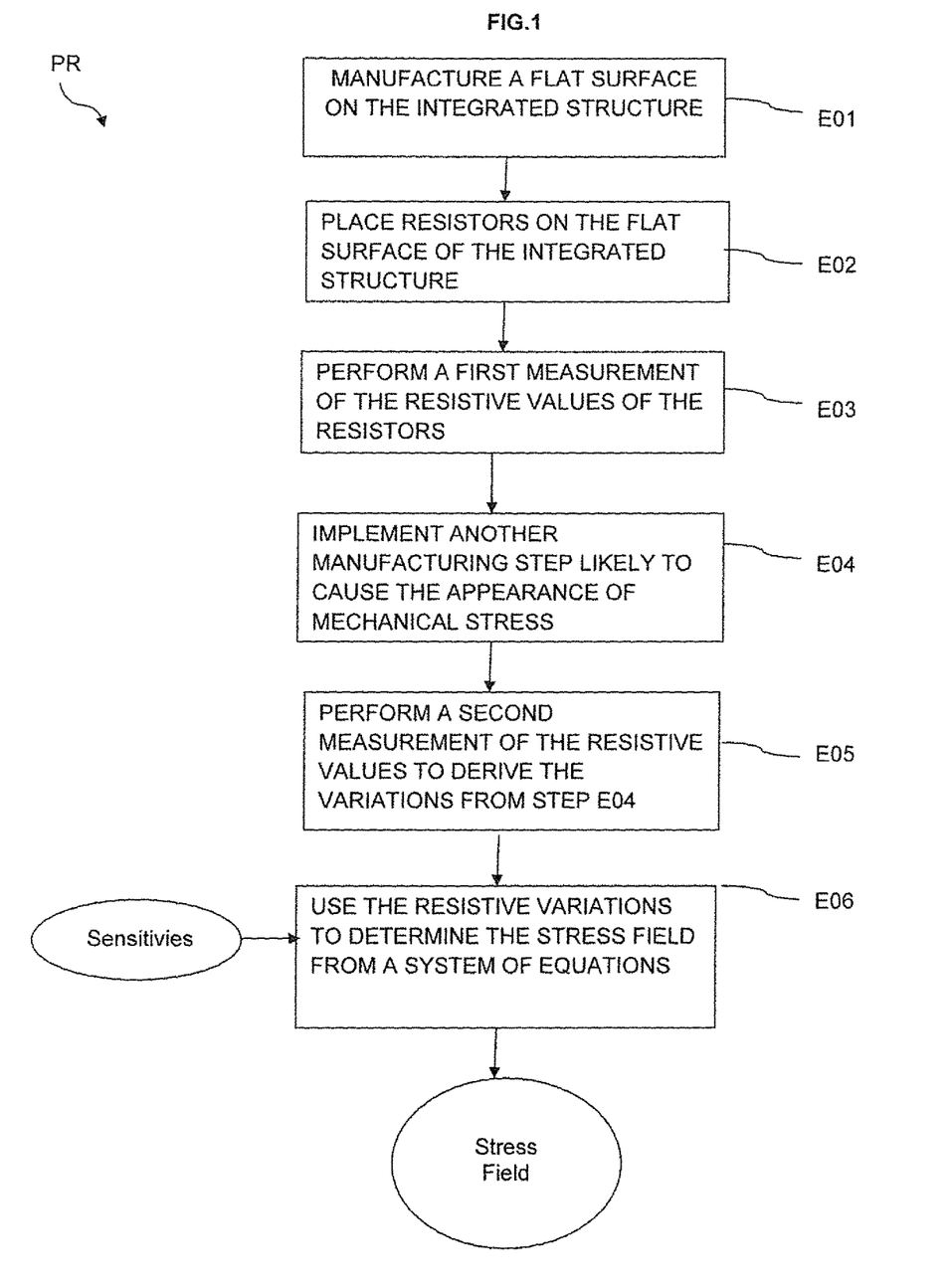
FIG. 1 shows different steps of a method according to an implementation of the invention.

The different steps of a method PR are provided in a flowchart in FIG. 1. This method can be used for determining values of components of a three-dimensional stress field within an object, an integrated structure, or a three-dimensional integrated structure as in this example.

In a first step E01, a flat surface of the integrated structure is manufactured. For example, this may be done by depositing or by an epitaxial growth of material. It is possible to deposit silicon dioxide, for example.

In a step E02, resistors are placed on the flat surface obtained after step E01. It is possible to deposit or form a conductive material, such as copper or aluminium, on this surface and then simultaneously form, for example by etching, at least four resistors with at least one having a geometry different from that of the other resistors.

A first measurement of the resistive values is carried out (step E03) on the resistors formed during step E02. The measured resistive values may be stored.

Another manufacturing step (step E04) is implemented, notably a manufacturing step likely to cause the appearance of mechanical stresses. By way of example, step E04 can be a step of depositing, etching, bonding or annealing. These examples are for illustration purposes and are not to being limiting.

To obtain variations of resistive values for the resistors, a second measurement of the resistive values is carried out to derive the variations therefrom (step E05).

The resistive variations are used during step E06 in which the stress field is determined from a system of equations involving this stress field, the variations of resistive values and sensitivity parameters of the resistors.

The determination of the sensitivity parameters can be implemented by a preliminary simulation step. In such a simulation step, for a type of resistor in which the geometry is known, different stresses are successively applied in different directions, such as longitudinal, transverse and vertical, for example. This is to determine the variations of the resistive value and to solve a system of equations.

The system of equations relate to the stress field applied by simulation, the variations of resistance obtained by each simulation, and the sensitivity values to be determined. In the three-dimensional case, it is thus possible to obtain three sensitivity values corresponding to the longitudinal sensitivity of a resistor, to the transverse sensitivity of a resistor, and to the vertical sensitivity of a resistor.

The simulation can be carried out by simulation software using the finite element method, for example, referred to as the COMSOL Multiphysics software produced by the COMSOL company. This determination of the sensitivity parameters is carried out for each resistor geometry.

A single reference system is used for all of the resistors for determining the stress field in the integrated structure. For resistors disposed as a rosette, or as a portion of a rosette, a three-dimensional reference system having three axes, x, y and z is used. The resistors are disposed in the plane defined by the axes x and y, with z being the vertical axis and the origin of the reference system being situated at the center of the rosette.

Each resistor in the rosette is disposed along a straight line passing through the origin of the reference system and forming an angle denoted by $\theta$.

For a resistor of the rosette, the variation of resistance $\Delta R/R$ is expressed as follows:

$$\Delta R/R = (\pi_L^* \cos^2\theta + \pi_T^* \sin^2\theta)^* \sigma_x + (\pi_L^* \sin^2\theta + \pi_T^* \cos^2\theta)^* \sigma_y + (\pi_L^* \sin^2\theta - \pi_T^* \sin^2\theta)^* \sigma_{xy} + \pi_z \sigma_z$$

where:
$\pi_L$ is the longitudinal sensitivity of the resistor,
$\pi_T$ is the transverse sensitivity of the resistor,
$\pi_z$ is the vertical sensitivity of the resistor,
$\sigma_x$ is the component of the stress field along the x axis,
$\sigma_y$ is the component of the stress field along the y axis, $\sigma_z$ is the component of the stress field along the z axis, and $\sigma_{xy}$ is the shear component in the x-y plane of the stress field.

The system to be solved for a group of resistors comprising four resistors, which are associated by indices i=1, 2, 3 and 4 and form a portion of a rosette, is expressed in the following matrix form. Only the terms of index i=1 have been shown for purposes of simplification:

$$\begin{bmatrix} \Delta R_1/R \\ \ldots \\ \ldots \\ \ldots \end{bmatrix} = S \times \begin{bmatrix} \sigma_x \\ \sigma_y \\ \sigma_{xy} \\ \sigma_z \end{bmatrix}$$

where:

$$S = \begin{bmatrix} \pi_{L1}\cdot\cos^2\theta_1 + \pi_{T1}\cdot\sin^2\theta_1 & \pi_{L1}\cdot\sin^2\theta_1 + \pi_{T1}\cdot\cos^2\theta_1 & \pi_{L1}\cdot\sin 2\theta_1 - \pi_{T1}\cdot\sin 2\theta_1 & \pi_{z1} \\ \ldots & \ldots & \ldots & \ldots \\ \ldots & \ldots & \ldots & \ldots \\ \ldots & \ldots & \ldots & \ldots \end{bmatrix}$$

By using at least one resistor having a different geometry, and therefore different sensitivity values $\pi_{Li}$, $\pi_{Ti}$ and $\pi_{Zi}$, the matrix denoted as S relating the vectors in the variations of resistances and the vector of the components of the stresses is an invertible matrix. This is not the case when using four identical resistors, which therefore results in the impossibility of solving the system of equations to obtain the stress field.

The three-dimensional stress field can therefore be obtained by the following system of equations:

$$\begin{bmatrix} \sigma_x \\ \sigma_y \\ \sigma_{xy} \\ \sigma_z \end{bmatrix} = S^{-1} \times \begin{bmatrix} \Delta R_1/R \\ \ldots \\ \ldots \\ \ldots \end{bmatrix} \quad (I)$$

Figure 2:
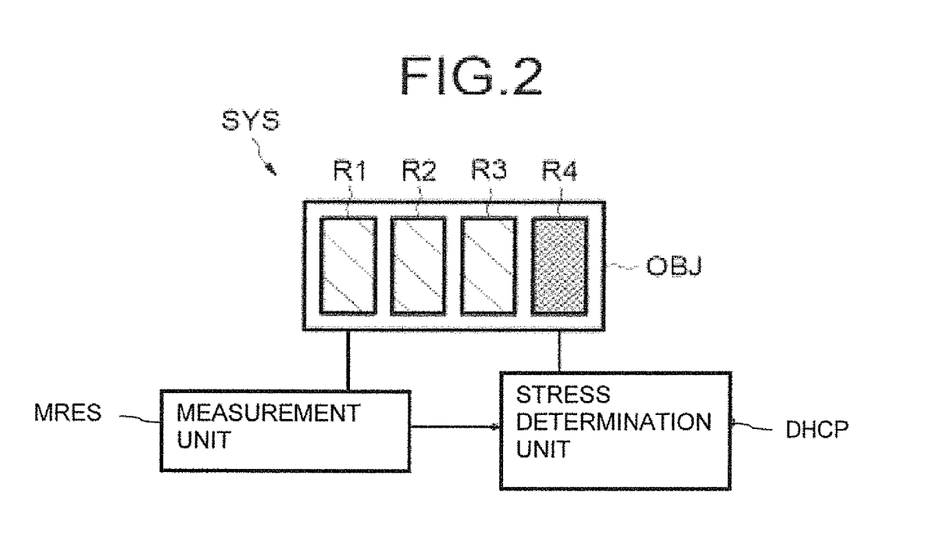
FIG. 2 is a diagram illustration of a system according to an embodiment of the invention.

FIG. 2 shows in a diagrammatic manner a system SYS configured for determining a three-dimensional stress field in an object OBJ. The object OBJ may be an integrated structure or a three-dimensional integrated structure, for example.

The object OBJ comprises four resistors R1, R2, R3 and R4, all of them having a serpentine shape. In this figure, the resistors R1 to R3 are cross-hatched in the same way to illustrate the fact that they all have the same geometry. That is, they have the same line width and the same spacing between the lines. The resistor R4 is shaded with a squared pattern and has a geometry different from that of the resistors R1 to R3.

The system SYS comprises a measurement unit MRES configured for measuring a variation of resistance. For example, the measuring unit MRES performs steps E03 and E05 described with reference to FIG. 1. Moreover, the system SYS comprisesa a stress determination unit DCHP configured for determining a stress field from the system of equations (I).

The measurement unit MRES can, for example, be a point measurement test set configured for applying the four-point measuring method, which is well known to those skilled in the art and is suitable for obtaining small resistive values of resistors. It is also possible to use a thermal module for studying the effect of temperature variations on the stress field by measuring the resistive values of resistors.

By using a thermal module the variation of resistive value of metal resistors that may be solely related to the rise in temperature can be taken into consideration. Calibration according to the technique known to those skilled in the art by the acronym TCR (Temperature Coefficient of Resistance) can be used for metal resistors. Finally, an electrical measurement can also be used through an encapsulation casing in which the integrated structure is placed. As for the stress determination circuitry DHCP, these can be produced in the form of a software module within a microcontroller, for example.

Figure 3:
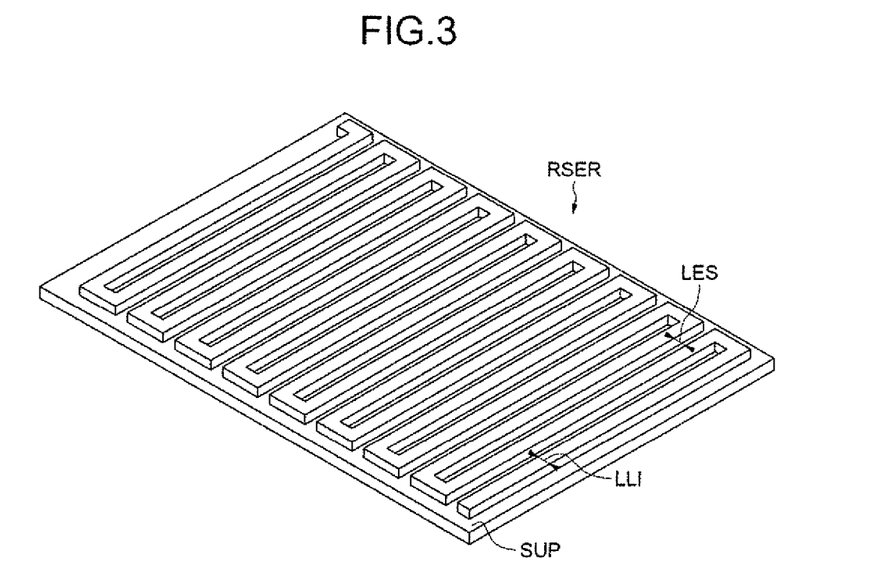
FIG. 3 shows an example of a resistor having a serpentine shape.

In FIG. 3, a serpentine shaped resistor RSER disposed on a support SUP comprising silicon dioxide has been shown. The resistor RSER can comprise a metal, such as copper or aluminium.

The parameters of the geometry of the resistor RSER that can be modified to obtain two different resistor geometries are notably the width of a line LLI and the width of the spacing between two adjacent lines of the sepentine shape LES.

These parameters make it possible to obtain particular values of sensitivity, and those skilled in the art will know how to adapt these parameters as a function of the sought sensitivity. It can, for example, be sought to maximize the longitudinal sensitivity. It can also be sought to maximize a non-axial sensitivity value (equal to the ratio between the longitudinal sensitivity and the sum of the transverse sensitivity and the vertical sensitivity).

Figure 4:
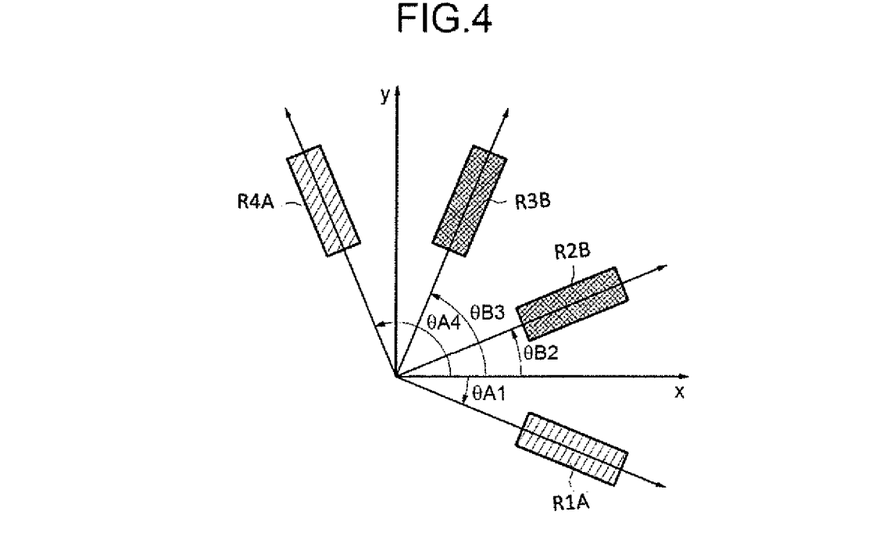
FIGS. 4-6 show different examples of arrangements of resistors according to the invention.

FIG. 4 shows in a diagrammatic manner an example of an arrangement of resistors R1A, R2B, R3B and R4A, making it possible to obtain a three-dimensional stress field in an object using the calculation described above. The four resistors form a portion of a rosette.

The resistors R1A and R4A have then same geometry and the resistors R2B and R3B have a different geometry. Each resistor is aligned along a straight line and all of the straight lines pass through the origin of a reference system of which the x and y axes have been shown. The angles used for the implementation of the calculation are the angles between these straight lines and the x axis. More precisely, the angle $\theta A1$ is the angle between the straight line corresponding to the resistor $\theta A1$ and the x axis, the angle is the angle between the straight line corresponding to the resistor $\theta B2$ and the x axis, the angle $\theta B3$ is the angle between the straight line corresponding to the resistor RB3 and the x axis and the angle $\theta A4$ is the angle between the straight line corresponding to the resistor RA4 and the x axis.

Figure 5:
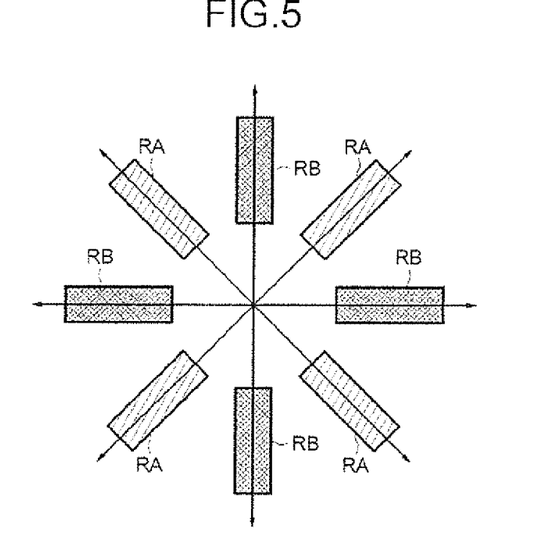
Figure 6:
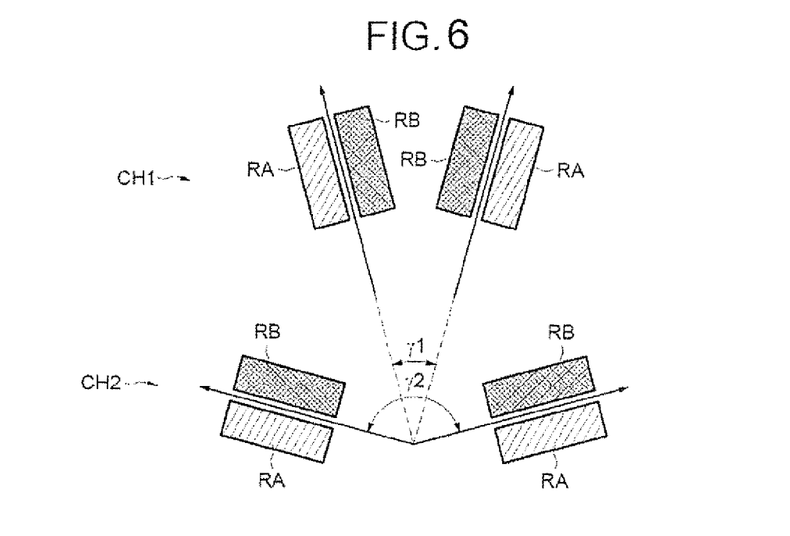

Other arrangements are possible, as shown in FIGS. 5 and 6. FIG. 5 shows an arrangement of eight resistors RA and RB disposed to form a complete rosette. The resistors bearing the reference RA have the same geometry, and the resistors bearing the reference RB have another geometry. The resistors RA and RB are disposed alternately within the rosette. As a variation, the four resistors RA can be disposed above the x axis in the figure and the four resistors RB can be disposed below the x axis.

The arrangement of resistors shown in FIG. 5 makes it possible to improve the results obtained in comparison with the arrangement described with reference to FIG. 4.

FIG. 6 shows another arrangement of eight resistors in which the resistors RA and RB form two aligned chevrons CH1 and CH2. For the first chevron CH1 is situated above the other one in the figure, the resistors RA are disposed below the resistors RB, and the chevron CH1 has an angle γ1 that can be acute.

For the second chevron CH2, the resistors RA are disposed below the resistors RB, and the chevron CH1 has an angle γ2 that can be obtuse. This arrangement makes it possible to use a smaller surface for placing the resistors.

Other arrangements of resistors are possible and some of them, comprising at least six resistors, make it possible to obtain a vertical shear component of a stress field.

According to another aspect, a measurement of the stress field in an object, in particular, in an integrated structure, is obtained in a simpler manner than with the techniques of the prior art. Notably, an approach is obtained that can be integrated easily and which uses passive components such as resistors that are easy to manufacture using the same material.

The invention claimed is:

1. A method for determining a three-dimensional stress field of an object having a flat surface, the method comprising:
    measuring variations in resistive values of a group of resistors on the flat surface of the object, with each resistor in the group of resistors having a same material concentration level, and with the group of resistors comprising at least four flat resistors, each resistor having a resistive value, and each resistor having a geometric shape defined by a line width and a line spacing forming the geometric shape, and at least one of the resistors having a geometric shape that is different from the geometric shape of the other resistors; and
    determining the three-dimensional stress field from a system of equations and based upon the measured variations in the resistive values and sensitivity parameters of the resistors, the sensitivity parameters including at least one of a longitudinal sensitivity, a transverse sensitivity and a vertical sensitivity.

2. The method according to claim 1, wherein all of the flat resistors in the group of resistors comprise a same material.

3. The method according to claim 1, wherein the object is configured as an integrated structure.

4. The method according to claim 1, further comprising:
    forming the object with the flat surface; and
    placing the group of resistors on the flat surface of the object.

5. The method according to claim 1, wherein measuring the variations in the resistive values comprises:
    performing a first measurement on the resistive values of the group of resistors;
    introducing mechanical stress on the object after the first measurement;
    performing a second measurement on the resistive values of the group of resistors after the at least one step; and
    comparing the resistive values from the first measurement with the resistive values from the second measurement to determine the variations in resistive values.

6. The method according to claim 1, further comprising determining the sensitivity parameters of the resistors based on a simulation of the object or a test performed on a test object.

7. A method for determining a three-dimensional stress field of an object having a flat surface, the method comprising:
    placing a group of resistors on the flat surface of the object, the group of resistors comprising at least four flat resistors, with each resistor in the group of resistors having a same material concentration level, and with each flat resistor having a resistive value, and each resistor having a geometric shape defined by a line width and a line spacing forming the geometric shape, and at least one of the resistors having a geometric shape that is different from the geometric shape of the other resistors;
    performing a first measurement on the resistive values of the group of resistors;
    introducing mechanical stress on the object;
    performing a second measurement on the resistive values of the group of resistors after introduction of the mechanical stress on the object;
    comparing the resistive values from the first measurement with the resistive values from the second measurement to determine variations in the resistive values; and
    determining the three-dimensional stress field from a system of equations and based upon the measured variations in the resistive values and sensitivity parameters of the resistors resistive values and sensitivity parameters of the resistors, the sensitivity parameters including at least one of a longitudinal sensitivity, a transverse sensitivity and a vertical sensitivity.

8. The method according to claim 7, wherein all of the flat resistors in the group of resistors comprise a same material.

9. The method according to claim 7, wherein the object is configured as an integrated structure.

10. The method according to claim 7, further comprising forming the object with the flat surface.

11. The method according to claim 7, further comprising determining the sensitivity parameters of the flat resistors based on simulation of the object or testing performed on a test object.

12. A method for determining a stress field of an object, the method comprising:
    measuring variations in resistive values of a group of resistors on a surface of the object, the group of resistors comprising a plurality of resistors, with each resistor in the group of resistors having a same material concentration level, and with each resistor having a resistive value, and each resistor having a geometric shape defined by a line width and a line spacing forming the geometric shape, and at least one of the resistors having a geometric shape that is different from the geometric shape of the other resistors; and
    determining the stress field based upon the measured variations in the resistive values and sensitivity parameters of the resistors, the sensitivity parameters including at least one of a longitudinal sensitivity, a transverse sensitivity and a vertical sensitivity.

13. The method according to claim 12, wherein all of the resistors in the group of resistors comprise a same material.

14. The method according to claim 12, wherein the object is configured as an integrated structure.

15. The method according to claim 12, further comprising:
forming the object with a flat surface; and
placing the group of resistors on the flat surface of the object.

16. The method according to claim 12, wherein measuring the variations in the resistive values comprises:
performing a first measurement on the resistive values of the group of resistors;
introducing mechanical stress on the object after the first measurement;
performing a second measurement on the resistive values of the group of resistors after the at least one step; and
comparing the resistive values from the first measurement with the resistive values from the second measurement to determine the variations in resistive values.

17. The method according to claim 12, further comprising determining the sensitivity parameters of the resistors based on a simulation of the object or a test performed on a test object.

18. A system comprising:
an object having a flat surface;
at least four flat resistors on the flat surface of said object, each resistor having a same material concentration level, and with each resistor having a geometric shape defined by a line width and a line spacing forming the geometric shape, and at least one of the resistors having a geometric shape that is different from the geometric shape of the other resistors;
a measurement unit configured to measure a variation of resistive values of said at least four flat resistors; and
a stress determination unit configured to determine a stress field from a system of equations involving the stress field, the measured variations in said at least four flat resistors, and sensitivity parameters of said at least four flat resistors, the sensitivity parameters including at least one of a longitudinal sensitivity, a transverse sensitivity and a vertical sensitivity.

19. The system according to claim 18, wherein all of said at least four flat resistors comprise a same material.

20. The system according to claim 18, wherein said object is configured as an integrated structure.

21. The system according to claim 18, wherein said at least four flat resistors comprise a conductive material comprising at least one of aluminium and copper.

22. The system according to claim 18, wherein each resistor has a resistive serpentine shape, and wherein said at least one resistor having a geometry different from that of the others comprises at least one of a resistive serpentine shape with a different spacing between lines forming the serpentine and a different width of lines forming the serpentine.

23. The system according to claim 18, wherein the object comprises four resistors forming a portion of rosette among which two first resistors have a first geometry and two second resistors have a second geometry.

24. The system according to claim 18, wherein the object comprises eight resistors forming a complete rosette among which four first resistors have a first geometry and four second resistors have a second geometry, the first and the second resistors being disposed alternately in the rosette or on either side of an axis passing through a middle of the rosette.

25. The system according to claim 18, wherein the object comprises eight resistors comprising:
a first group of four resistors among which two resistors have a first geometry and two resistors have a second geometry, the first and the second resistors of the first group being disposed respectively on either side of a first chevron having a first angle; and
a second group of four resistors among which two resistors have the first geometry and two resistors have the second geometry, the first and the second resistors of the second group being disposed respectively on either side of a second chevron having a second angle different from the first angle, with first chevron and the second chevrons being aligned.

26. A device comprising:
an object;
a flat surface on said object;
at least four flat resistors on said flat surface, each resistor having a same material concentration level, and with each resistor having a geometric shape defined by a line width and a line spacing forming the geometric shape, and with at least one of the resistors having a geometric shape that is different from the geometric shape of the other resistors;
said at least four flat resistors configured to be coupled to a measurement unit to measure a variation of resistive values thereof, and a stress determination unit configured to determine a stress field from a system of equations based upon the measured variations and sensitivity parameters of said at least four flat resistors, the sensitivity parameters including at least one of a longitudinal sensitivity, a transverse sensitivity and a vertical sensitivity.

27. The device according to claim 26, wherein all of said at least four flat resistors comprise a same material.

28. The device according to claim 26, wherein said object is configured as an integrated structure.

29. The device according to claim 26, wherein said at least four flat resistors comprise a conductive material comprising at least one of aluminium and copper.

30. The device according to claim 26, wherein each resistor has a resistive serpentine shape, and wherein said at least one resistor having a geometry different from that of the others comprises at least one of a resistive serpentine shape with a different spacing between lines forming the serpentine and a different width of lines forming the serpentine.

31. The device according to claim 26, wherein said at least four flat resistors form a portion of rosette among which two first resistors have a first geometry and two second resistors have a second geometry.

32. The device according to claim 26, wherein said at least four flat resistors comprises eight flat resistors forming a complete rosette among which four first resistors have a first geometry and four second resistors have a second geometry, the first and the second resistors being disposed alternately in the rosette or on either side of an axis passing through a middle of the rosette.

33. The device according to claim 26, wherein said at least four flat resistors comprises eight flat resistors forming:
a first group of four resistors among which two resistors have a first geometry and two resistors have a second geometry, the first and the second resistors of the first group being disposed respectively on either side of a first chevron having a first angle; and
a second group of four resistors among which two resistors have the first geometry and two resistors have the second geometry, the first and the second resistors of the second group being disposed respectively on either side of a second chevron having a second angle different from the first angle, with first chevron and the second chevrons being aligned.

* * * * *